(12) United States Patent
Parrott et al.

(10) Patent No.: US 6,255,918 B1
(45) Date of Patent: Jul. 3, 2001

(54) MICROWAVE FERRITE RESONATOR MOUNTING STRUCTURE HAVING REDUCED MECHANICAL VIBRATION SENSITIVITY

(75) Inventors: Ronald A. Parrott, Healdsburg; Christopher L. London, Santa Rosa, both of CA (US)

(73) Assignee: Verticom, Inc., Santa Rosa, CA (US)

( * ) Notice: Subject to any disclaimer, the term of this patent is extended or adjusted under 35 U.S.C. 154(b) by 0 days.

(21) Appl. No.: 09/295,208

(22) Filed: Apr. 1, 1999

(51) Int. Cl.[7] ................. H01P 1/20; H01P 7/00
(52) U.S. Cl. ............ 333/202; 333/219; 333/219.2
(58) Field of Search .................. 333/202, 219, 333/219.2

(56) References Cited

U.S. PATENT DOCUMENTS

| 4,247,837 | 1/1981 | Mezak et al. | 333/202 |
|---|---|---|---|
| 4,283,691 | 8/1981 | Burgoon | 331/116 |
| 4,480,238 | 10/1984 | Iwasaki | 333/202 |
| 4,651,116 | 3/1987 | Schloemann | 333/235 |
| 4,758,800 | 7/1988 | DiBiase et al. | 331/1 R |
| 4,988,959 | 1/1991 | Khanna et al. | 331/117 |
| 5,115,209 | 5/1992 | Grace et al. | 331/49 |
| 5,200,713 | 4/1993 | Grace et al. | 331/49 |
| 5,220,292 | 6/1993 | Bianchini et al. | 331/1 R |
| 5,291,163 | 3/1994 | Finkle et al. | 333/219.2 |
| 5,298,872 | 3/1994 | Trump et al. | 333/202 |
| 5,428,324 | 6/1995 | Andersson et al. | 333/202 |
| 5,517,161 | 5/1996 | Andersson et al. | 333/202 |

FOREIGN PATENT DOCUMENTS 2161653  1/1995  (GB) .

Primary Examiner—Robert Pascal
Assistant Examiner—Patricia T. Nguyen
(74) Attorney, Agent, or Firm—Townsend and Townsend and Crew LLP; Kenneth R. Allen

(57) ABSTRACT

A coupling structure for a ferrite-based resonator comprises a short, stiff mounting rod and ferrite sphere are mechanically coupled to a substrate that provides support for a stiff coupling loop. The structure reduces differential movement between the sphere and the coupling loop, thereby reducing vibration-induced degradation of resonator performance. This resonator structure may be used in tunable, wideband oscillator, filter, or amplifier circuits, for example. In one embodiment, the mounting rod is a poor thermal conductor, thereby thermally isolating the sphere, which becomes nearly isothermal.

4 Claims, 5 Drawing Sheets

MICROWAVE FERRITE RESONATOR MOUNTING STRUCTURE HAVING REDUCED MECHANICAL VIBRATION SENSITIVITY

BACKGROUND OF THE INVENTION

This invention relates to structures for high frequency fundamental resonators, particularly for frequency sources and for filters. More particularly, the invention relates to ferrite oscillators and filters, such as yttrium-iron-garnet ($Y_3Fe_5O_{12}$ or YIG) oscillators and filters.

Ferrite resonators are a favored type of resonator for both oscillator and filter applications because of their typically high resonant frequency (about 1 GHz to about 100 GHz), wide tuning range (typically over one octave), linear tuning characteristics, and spectral purity (high Q factor). A ferrite element may be used in a resonator structure in several ways.

A preferred type of ferrite element is a highly polished sphere of single-crystal material. A spherical shape provides a boundary condition that approximates an infinite volume of ferrite material (thus allowing uniform and predictable resonant modes), and a highly polished surface minimizes surface scattering, and improves the resonant quality of the sphere. The sphere is typically placed in a magnetic circuit, such as within a gap between two magnetic pole faces, that applies a magnetic field sufficient to magnetically saturate the sphere and initiate resonance. A loop or loops couple to the sphere and may transfer resonant energy into or out of the sphere.

Some conventional oscillators attach a ferrite sphere to a long, slender mounting rod, which is inserted through the body of the magnetic circuit to hold the sphere in the air gap near the coupling loops. Most rods are made of electrically non-conductive material near the sphere to avoid eddy currents in the rod affecting the electromagnetic field pattern near the sphere. Some rods have been fabricated out of sapphire or alumina. Other rods use a non-conductive tip in an otherwise metal rod. Such tips have been made of beryllia (BeO), in addition to alumina ($Al_2O_3$) and sapphire tips. These non-conductive materials are often chosen for their relatively high thermal conductivity.

The resonant frequency of a ferrite element may drift with temperature. The amount of frequency drift of a YIG sphere over temperature, for example, depends on the crystallographic orientation of the sphere to the applied magnetic field. Certain orientations will exhibit a positive frequency drift with increasing temperature, and others will exhibit a negative frequency drift with increasing temperature. Between these two regions lie thermally-compensated (TC) axes, as is known in the art, where the resonant frequency does not drift with temperature. These TC axes are usually a desirable orientation, hence provision is typically made to rotate the sphere-rod assembly within the resonant structure to align a TC axis with the applied field.

Achieving the ideal, or near ideal, TC solution angle typically involves orienting the sphere along a known axis prior to mounting the sphere on a rod. Orienting the sphere and/or subsequent mounting of the sphere usually requires specialized equipment and knowledge. One crystallographic orientation commonly used for this purpose is to align the sphere so that a [110] axis is normal to the axis of mechanical rotation, and thus a (110) plane may be normal to the applied field.

This alignment can be very difficult to achieve, and some ferrite resonator applications couple significant power to the sphere, thereby heating it. For these reasons, some conventional designs have sought to remove heat from the sphere via its mounting rod to reduce temperature effects. However, providing a heat conduit down the mounting rod may create a thermal gradient across the sphere, altering its uniform resonant characteristics and producing other temperature effects.

Conventional designs typically clamp the rod 101 to the body of the magnetic circuit after aligning a sphere 114, which may be attached to the rod 101 with adhesive 116, in the resonant circuit, as shown in FIG. 1A. This may create a cantilever member supporting the sphere 114, which may be susceptible to mechanical vibration. The cantilevered sphere may move differentially from the loop 115 that is mounted on a substrate 111, and induce a mechanical resonance that appears as phase jumps or frequency breaks offset from the tuned frequency of the structure, as shown in FIG. 1B, or as an instantaneous change in the resonant frequency. Such vibration-induced responses are highly undesirable in both oscillator and filter applications. For example, a vibration-induced phase jump may pull a phase-locked oscillator outside of its phase-locked loop bandwidth, thereby losing the desired output until phase lock is re-established.

One approach to avoid differential motion between a ferrite sphere and its coupling loop is to glue or otherwise fix the sphere under the loop in the magnetic circuit. This approach does not allow in situ TC axis alignment, however, and therefore these structures may exhibit higher thermal drift. Gluing a sphere in a resonator structure also makes it impractical to swap ferrite spheres in and out of the resonator structure. Spheres may have inclusions or other defects that are not apparent until the sphere is placed in the resonant structure, where the defects cause power holes, crossing resonant modes, or other problems. Often, swapping the sphere would destroy the microcircuit and coupling loop.

Therefore, it is desirable to reduce the differential motion between a ferrite sphere and associated coupling structures in a resonant circuit. It is also desirable to accomplish this in a manner that allows ferrite spheres to be exchanged in a resonant structure without damage to other components of the resonant structure, and to provide a resonant structure less sensitive to thermal variations.

SUMMARY OF THE INVENTION

According to the invention, a resonating element is mounted on a mechanically stiff support structure to reduce differential motion between the resonating element and a coupling element. The support structure allows controllable insertion, removal, and rotation of the resonating element with respect to the RF coupling element. The support structure may be mechanically coupled to the RF coupling element to further reduce differential motion between the resonating element and the RF coupling element.

In a specific embodiment, a support structure for a ferrite-based resonator comprises a stiff mounting rod supporting a YIG sphere that is mechanically coupled through a mounting bracket to a substrate that supports an RF coupling loop. This support may be placed within a magnetic circuit, such as within an air gap of an electromagnet, to provide a broadband resonant circuit suitable for oscillators or filters, for example. The mounting rod has a bearing surface which allows it and the sphere to be rotated within the magnetic circuit assembly, and allows changing the ferrite sphere. The structure reduces the differential movement between the coupling loop and the ferrite sphere that may arise from vibration and degrade resonator performance.

The mounting rod is preferably made from an electrically and thermally non-conductive material, such as plastic. The substrate may further include a hybrid microcircuit patterned on its surface which may include active devices, such as GaAs Darlington ICs. A thermally nonconductive mounting rod reduces heat flow to or from the sphere down the mounting rod, thus resulting in a more isothermal sphere than conventional designs. A chip heater may be added to the assembly to uniformly control the assembly temperature above the ambient temperature. The small size and thermal mass of the assembly makes the use of a chip heater practical.

The invention will be better understood by reference to the following detailed description in connection with the accompanying drawings.

DESCRIPTION OF SPECIFIC EMBODIMENTS

Figure 1A:
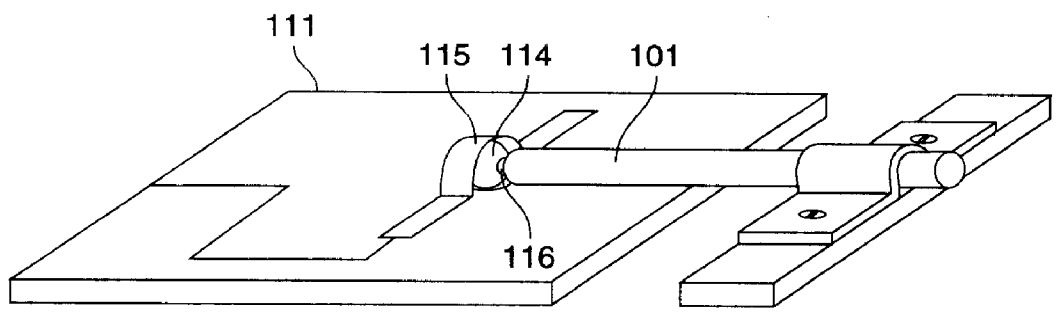
FIG. 1A is an simplified orthogonal view of a cantilever mounting rod and YIG sphere that are mounted separately from a loop and substrate.
Figure 1B:
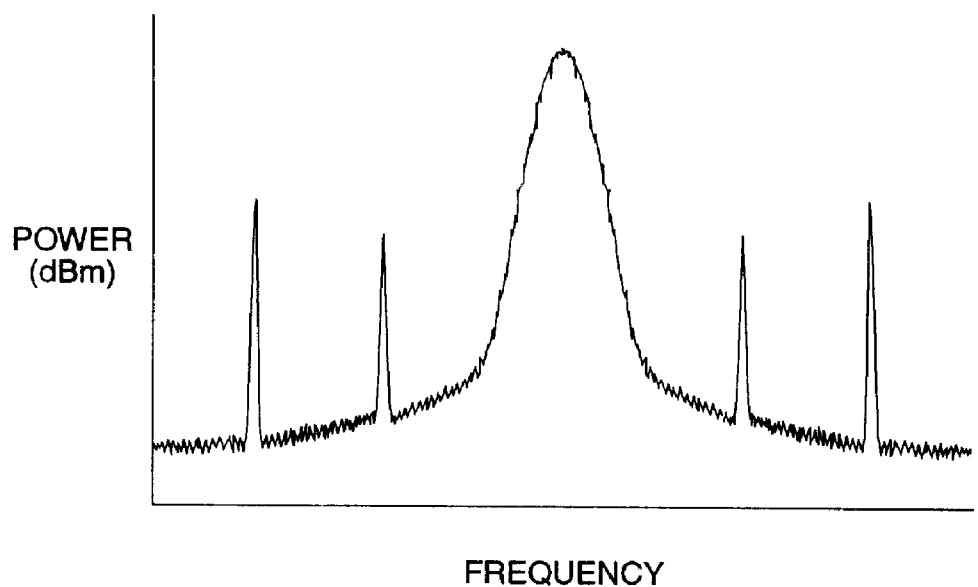
FIG. 1B is a representative plot of oscillator output power versus frequency at an instant in time subsequent to a mechanical stimulus to the mounting structure of FIG. 1A, in which the ferrite sphere is moving differentially with respect to the coupling loop.
Figure 2:
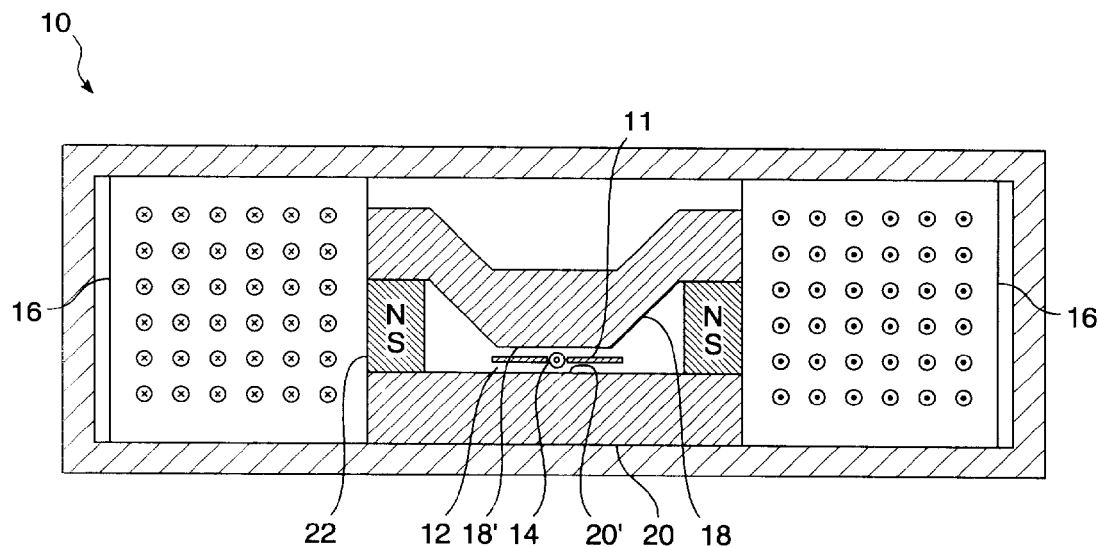
FIG. 2 is a simplified cross-sectional view of an exemplary magnetic circuit which may incorporate the present invention.

FIG. 2 shows a cross-sectional view of an exemplary magnetic circuit which may incorporate the present invention. A YIG sphere 14 and substrate 11 are placed within a gap 12 within a magnetic circuit 10. A substrate 11 provides mechanical support for the coupling loops (not shown) and other components. The YIG sphere 14 is typically highly polished (to a specular finish) and is between about 5 mils and 40 mils in diameter. In a specific embodiment, The YIG sphere is about 10 mils in diameter, is highly polished, and is fabricated from a single crystal. The magnetic circuit 10 provides a high-intensity, controlled magnetic field between the opposing magnet pole faces 18' and 20'. A relatively large electromagnet 16, shaped in the form of a solenoid, surrounds a gap 12 and creates a magnetic flux field across the gap 12. A permanent magnet 22 may provide a constant bias of magnetic flux parallel to the flux from the electromagnet 16. This may reduce the drive current through the electromagnet 16 that would otherwise be required to saturate the YIG sphere 14 and initiate oscillation.

A first high-permeability element 18 and a second high-permeability element 20 define a working flux path across the gap 12. The YIG sphere 14, which is within this gap, may resonate in the presence of the magnetic field, and its frequency of resonance may be tuned by varying the magnetic field. A suitable structure is more completely described in U.S. Pat. No. 5,677,652, issued Oct. 14, 1997 and entitled "Microwave Ferrite Resonator With Parallel Permanent Magnet Bias" by Ronald Parrot, commonly-assigned and incorporated in its entirety herein by reference for all purposes.

Figure 3:
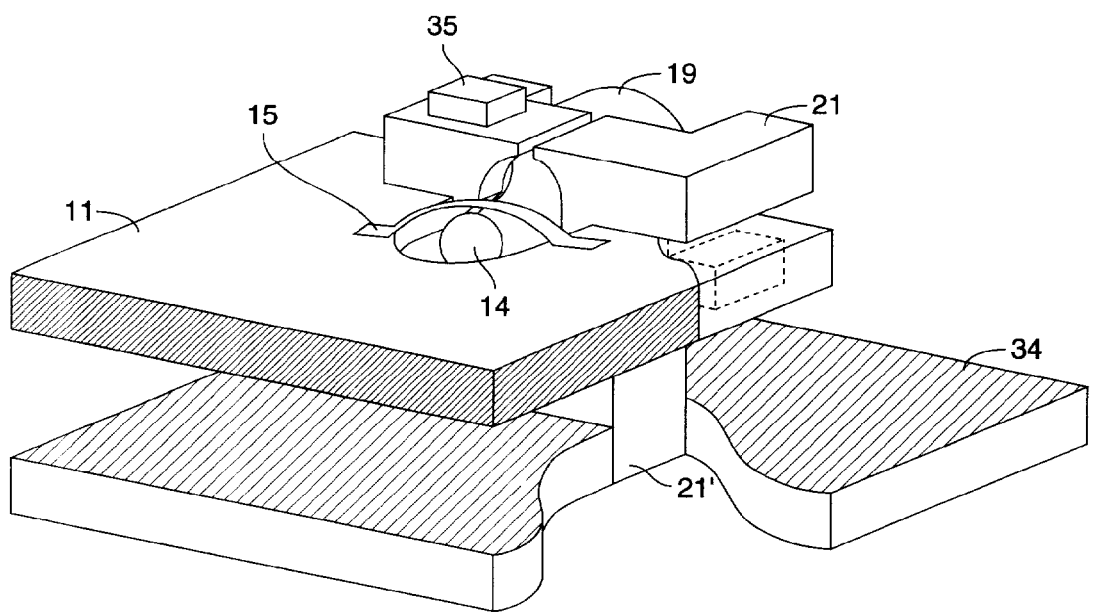
FIG. 3 is a simplified isometric view of one embodiment of a resonator structure according to the present invention showing a YIG mounting structure coupled to a loop support structure.

FIG. 3 is a simplified isometric view of one embodiment of a resonator structure according to the present invention which may be incorporated in the magnetic circuit shown in FIG. 2. In FIG. 3, a rod 19 is mechanically coupled to a bracket structure, or assembly holder 21, which also supports a substrate 11. The assembly holder 21 includes an integrated mounting beam 21' that couples the bracket structure to the mounting plane 34. As shown in FIG. 3, the mounting beam is integrated in the assembly holder and is mounted at one end to the mounting plane 34, forming a cantilever mounting structure. The assembly holder 21 may be made of any suitably stiff material, and in a preferred embodiment is electron-discharge machined (EDM) from beryllium-copper alloy.

The substrate 11 may be a dielectric material suitable for forming microcircuits on, such as alumina, sapphire, beryllium oxide, polymer or polymer composite, or mica. In a preferred embodiment, a co-planar circuit is defined on the upper surface of an alumina substrate 11; however, a microstrip circuit or other types of circuits could also be utilized. One advantage of a co-planar circuit is that the backside of the substrate 11 need not be metallized, allowing a co-planar circuit to be defined prior to grinding or polishing the backside of the substrate.

A coupling loop 15 is bonded to the substrate 11 using electro-welding, or other suitable means, such as thermo-compression wedge bonding. In a preferred embodiment, loops are photo-formed and bent from beryllium-copper alloy sheet, but other processes, such as EDM or laser cutting may also be used to fabricate the loops. The loops are typically gold plated to facilitate bonding to the substrate 11, but this is not necessary for all bonding processes, such as conductive epoxy bonding. It is preferable to form a loop from metal sheet, particularly beryllium-copper, because it produces a stiff loop that is relatively resistant to mechanical vibration.

Figure 4:
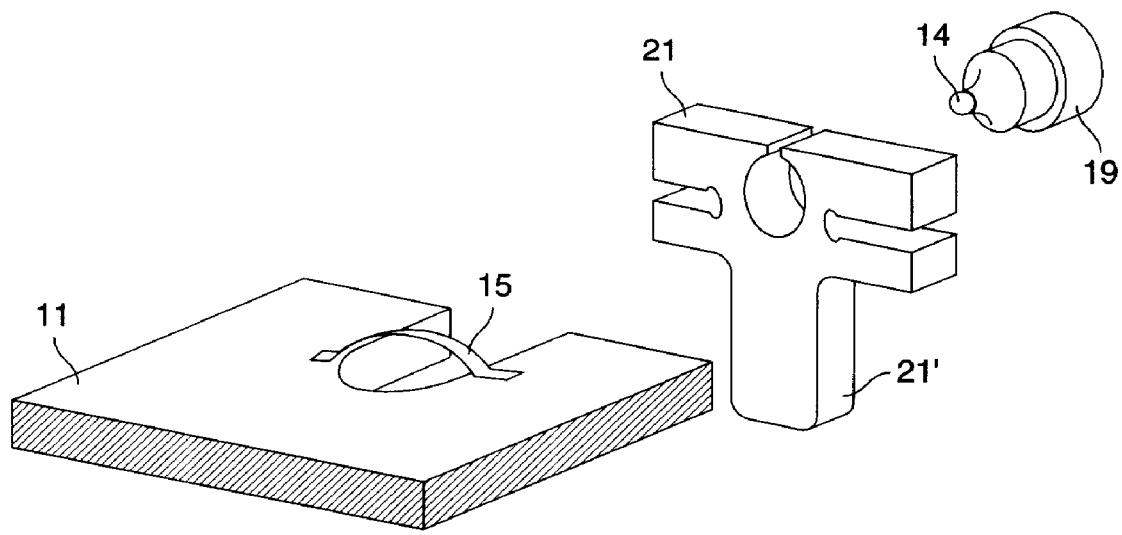
FIG. 4 is a simplified exploded view of the resonator structure of FIG. 3.

FIG. 4 shows an exploded view of the substrate 11, rod 19, YIG sphere 14, and assembly holder 21. The assembly holder 21 mechanically couples the rod 19 to the substrate 11, thereby reducing differential vibrational motion between the sphere 14 and the loop 15. In a preferred embodiment, both the substrate 11 and the rod 19 are press-fit into the assembly holder 21, but other methods of assembly, such as gluing or securing with a set screw or indent, could be used. A pliers-like compression tool (not shown) may clamp and elastically distort the substrate 11 and the assembly holder 21 during insertion of the rod 19 so that when the compression tool is removed the assembly holder 21 securely holds the rod 19.

The rod 19 may be fabricated by a variety of methods, such as injection molding or machining, from a variety of materials. It is preferable that the material chosen be electrically and thermally non-conductive. It is further desirable that the material be elastically lossy, to minimize vibrational energy transfer to the sphere. Several plastic materials may be used to fabricate suitable YIG rods. Polymer materials, such as that sold under the trademark VESPEL® SP-1 by E.I. DuPont de Nemours and Co., or polyimide materials are preferred materials because of their dimensional stability over temperature, mechanical strength, ease of fabrication, and relatively low cost compared to ceramic materials. Additionally, these polymer materials form good bearing surfaces, which may allow smooth and accurate rotation of the rod 19 within the assembly holder 21. Furthermore, the assembly holder 21, substrate 11, and rod 19 may be configured so as to place the center of inertial moment through the center of the assembly holder 21, thereby further reducing vibrational differential motion between the sphere 14 and the loop 15 and the sphere 14 and magnetic poles faces 18' or 20'. For example, the substrate 11 could be extended on the side of the assembly holder 21 opposite the loop 15 to counter-weight the assembly holder 21.

Figure 5:
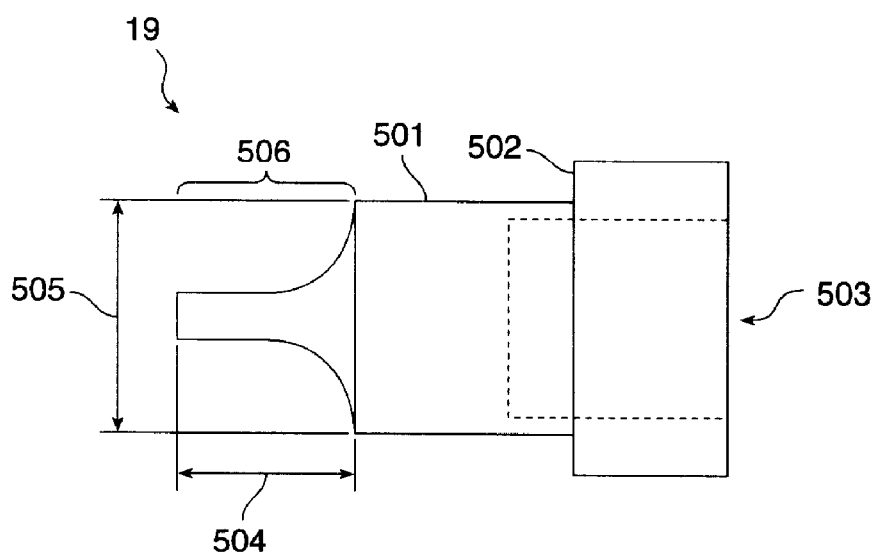
FIG. 5 is a side view of one embodiment of a YIG rod.

FIG. 5 shows a simplified side view of a rod according to a preferred embodiment of the present invention. The rod 19 has a bearing surface 501 that may be press-fit into the assembly holder (not shown). A side face 502 limits the depth of insertion of the rod 19 into the assembly holder and provides additional mechanical support between the rod 19 and the assembly holder. The unsupported length 504 of the rod 19 is less than the bearing diameter 505. This results in an unsupported rod portion 506 with an aspect ratio less than one.

The rod 19 has a torque engagement means 503, formed as part of the rod 19, that allows the rod 19 to be rotated after inserting it into the assembly holder. In a preferred embodiment, the torque engagement means is a hexagonal drive receptacle, however, other types of receptacles or even a slotted head could be used.

Figure 6:
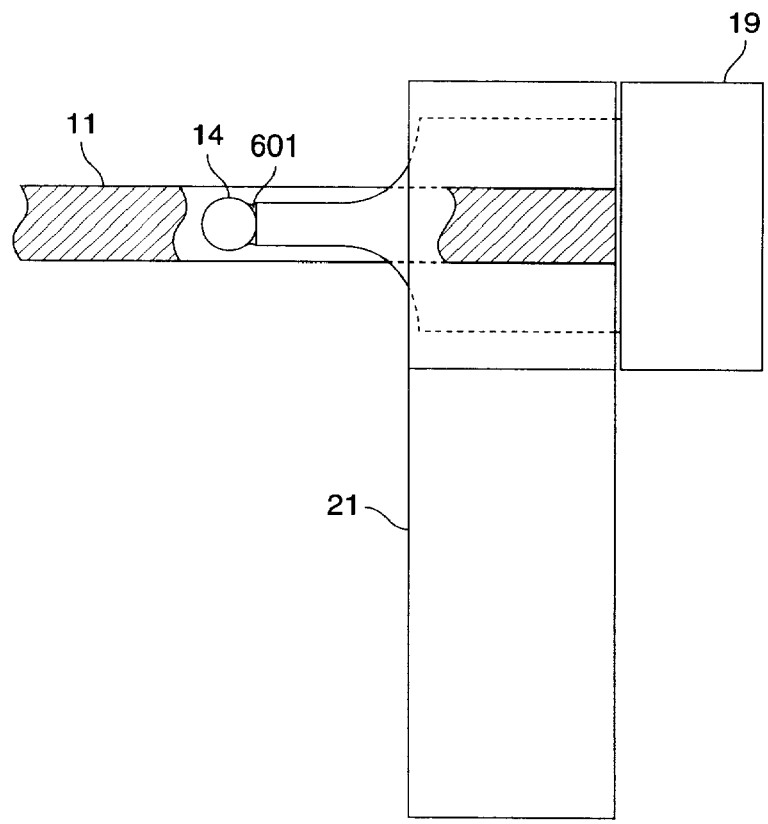
FIG. 6 is a simplified side view of an assembly member, as it relates to a substrate and a YIG rod.

FIG. 6 shows a rod 19 in conjunction with an assembly holder 21. A YIG sphere 14 has been attached to the rod 19 with an adhesive 601. In a preferred embodiment, the adhesive 601 does not shrink around the YIG sphere 14 in a fashion that causes residual stress in the YIG sphere 14. Epoxy resin is a preferred adhesive material for this reason. In this embodiment, the diameter of the YIG sphere 14 is shown to be less than the thickness of the substrate 11; however, the diameter of the YIG sphere 14 could be greater than the thickness of the substrate 11.

Figure 7:
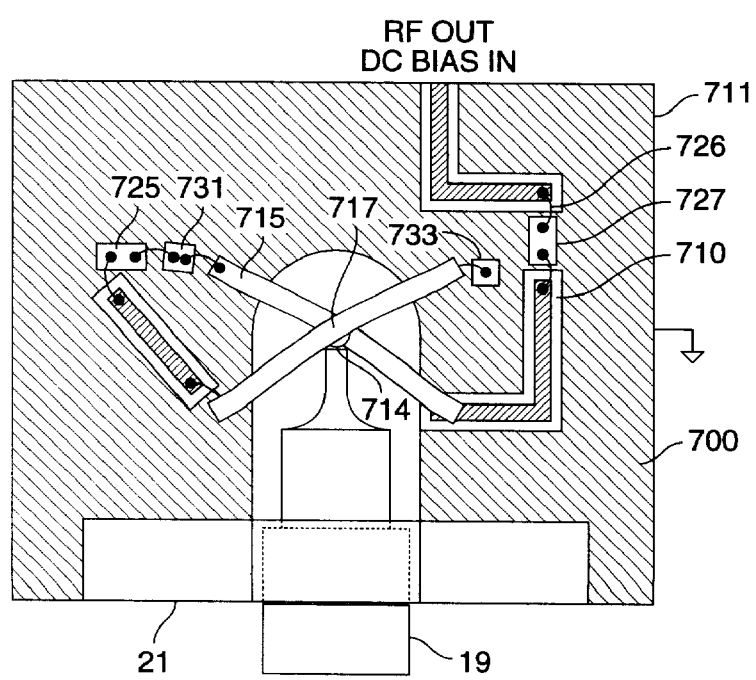
FIG. 7 is a simplified top view of an embodiment of the present invention as an oscillator incorporating GaAs Darlington ICs on a co-planar hybrid microcircuit substrate.

FIG. 7 is a simplified top view of another embodiment of the present invention as may be used in an oscillator. Coupling loops 715 and 717 are bonded to the substrate 711, as discussed above. The loops do not need to be orthogonal to each other, as is typical in YIG filter structures where coupling between the loops may degrade the filter's isolation characteristics. An active element 725 may be attached directly to a ground plane of the substrate 711 using conductive epoxy, solder, or other means. In a preferred embodiment, the active element 725 is a gallium-arsenide (GaAs) integrated circuit (IC) that includes a Darlington pair of bipolar transistors. A blocking capacitor 731 DC isolates the active element 725 from a buffer amplifier 727.

A coupling capacitor 733 provides a path to ground for radio frequency (RF) signals within the oscillator bandwidth while blocking DC from the active element 725. Wire bonds 726 (only some of which are shown), including multiple parallel wire bonds, may be used to inter-connect the active element 725, coupling capacitor 733, blocking capacitor 731, buffer amplifier 727, co-planar microcircuit 710, and other circuit elements (not shown). Other means, such as thermocompression wedge bonding of ribbon or mesh may alternatively be used to interconnect circuit elements, as is known in the art.

In a specific embodiment, a sphere 714 with a 10 mil diameter was loosely coupled to a pair of gold-plated beryllium-copper half loops 715, 717, each formed with a nominally 20 mil diameter. The YIG sphere was manufactured from a single crystal, and was gallium-substituted (also known as gallium doped) to lower the minimum frequency of operation, as is known in the art. Gallium substitution allows YIG components to operate as low as 500 MHz. For the purposes of this specification and associated claims, "YIG" is intended to describe pure YIG or substituted YIG. The internal magnetization saturation field strength×4Π (4ΠM$_s$)of the sphere was about 600 Gauss. The resulting oscillator produced at least 1 mW of power from between 2 GHz to 9.5 GHz.

Figure 8:
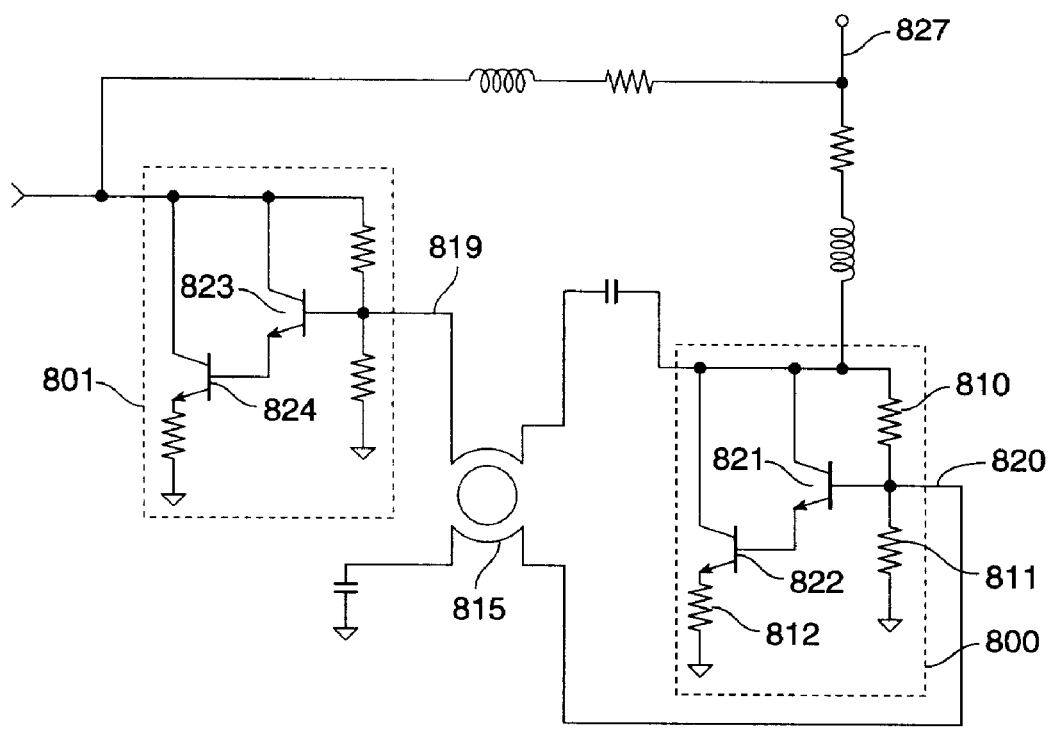
FIG. 8 is a simplified equivalent circuit diagram of the oscillator configuration shown in FIG. 7.
Figure 9:
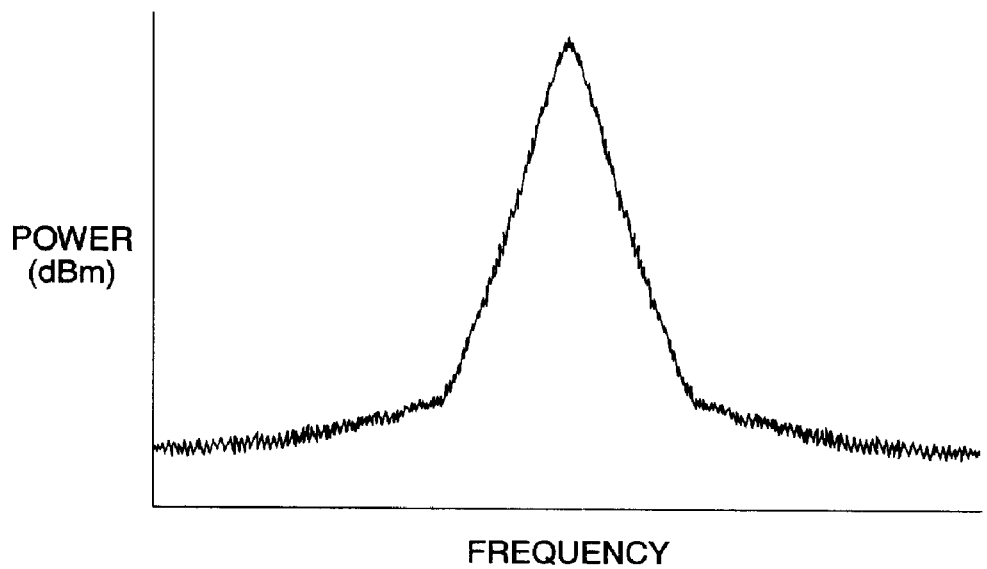
FIG. 9 is a representative plot of oscillator output power versus frequency, subsequent to a mechanical impulse stimulus, in which the ferrite sphere and coupling loop are assembled according to the present invention, thus reducing differential motion.

FIG. 8 is a simplified circuit diagram of the oscillator shown in FIG. 7. Transistors 821, 822, 823, and 824 are GaAs bipolar transistors. Transistors 821 and 822 form a Darlington pair and may be fabricated on a single chip of GaAs, along with input resistors 810 and 811 and load resistor 812. One reason the Darlington pair configuration is preferred is that it provides an active element with low input reactance, but high output power. Darlington input transistor 821 may be small, minimizing base-emitter capacitance for example, while Darlington output transistor 822 may be optimized for power output. Therefore, the base impedance of the input transistor may have relatively little reactance.

The resistance values of the input resistors 810 and 811 may be chosen as to provide an appropriate bias voltage on the base of Darlington input transistor 821, as is known in the art. The DC bias power may be applied through bias port 827, or through other appropriate bias points. In one embodiment, the values of the input resistors 810 and 811 are additionally chosen such that the input impedance at the first active element port 820 is nominally 50 ohms, but other values will also work.

Fabricating the active element 800 as an integrated circuit keeps parasitic reactances low, such as the reactances associated with conventional wire-bonded microcircuits. Therefore, not only is the input impedance at the first active element port 820 a fairly constant 50 ohms, it is also nearly completely resistive. Because the input impedance of the first active element port 820 is resistive, it has very little reactance that may form a resonant circuit with the characteristic reactance of the input loop 815. The buffer amplifier 801 operates similarly to provide a predominately resistive 50 ohm input impedance at the buffer amplifier input port 819. A more complete description of this circuit is provided in commonly-assigned U.S. Pat. No. 5,801,591, issued Sep. 1, 1998 entitled "Microwave Linear Oscillator/Amplifier Utilizing A Multicoupled Ferrite Resonator" by Parrott et al., which is herein incorporated in its entirety by reference for all purposes.

The degree of coupling between a loop and a resonating ferrite sphere is a function of the proximity of the loop to the sphere. The quality (Q) of the resonance is the resonant frequency divided by the 3 dB bandwidth. The 3 dB bandwidth is the width, in frequency, of the resonance 3 dB below the maximum power level. A higher Q resonator has a narrower 3 dB bandwidth and hence a higher Q. Q is a measure of the rate at which energy is lost from the resonant structure and may be affected by many factors, including the surface finish of the sphere (scattering the uniform precessional mode at the surface), the atomic composition of the ferrite, voids or non-magnetic inclusions within the sphere (scattering the uniform precessional mode within the sphere or de-coupling magnetic moments within the sphere), residual strain within the sphere, and coupling between the sphere and loop.

A loop-sphere is "critically coupled" if one-half the energy of each resonant cycle in the ferrite sphere is coupled into the loop. In a "loosely coupled" structure the Q approaches the unloaded Q of the resonator. In a "tightly coupled" structure the Q of the resonator is degraded by the power coupled from the sphere to the load connected to the loop. An active element with high gain and resistive input impedance, such as the Darlington pair discussed above, allows a loosely coupled loop-sphere structure, providing oscillations over a wide bandwidth.

Loosely coupling to a resonating sphere has other advantages, as well. Many conventional ferrite oscillators tightly couple to the sphere to provide sufficient power at the active element to maintain oscillation. More tightly coupled structures typically drive more power through the sphere, which tends to heat the sphere. This in turn may create a thermal gradient within the sphere, especially if heat is lost at the point where the sphere is mounted to the rod. Because the resonant characteristics of the ferrite typically are affected by temperature, a non-uniform temperature throughout the sphere may produce unexpected and unwanted results. Fabricating the YIG rod from a plastic of poor thermal conductivity minimizes the heat transfer to or from the sphere through the rod, thereby minimizing the thermal gradient across the sphere and allowing it to thermally "float" within the resonator.

In some instances, it may be desirable maintain the ferrite sphere and other components, such as an active element and a buffer amplifier, at a constant temperature. One way to achieve this is to controllably heat the components above the highest expected ambient temperature. Referring to FIG. 3, a chip heater 35 may be mounted to the assembly holder 21, which may be thermally coupled to the substrate 11. This may create a substantially isothermal assembly, reducing the operational drift of components resulting from changes in the ambient temperature. The isothermal characteristics of this assembly may be enhanced if the assembly holder is attached to a mounting plane 34 through a relatively long, narrow, or thin mounting beam 21'. This would increase the thermal resistance between the assembly holder 21 and the mounting plane 34, thereby reducing the heat loss from the assembly holder 21. A thermally isolated assembly holder would allow heater temperature control of the assembly with less input power to the heater chip.

The invention has now been explained with reference to specific embodiments. Other embodiments will be apparent to those of ordinary skill in the art. It is therefore not intended that this invention be limited, except as indicated by the appended claims.

What is claimed is:

1. A resonator structure for operating within a magnetic circuit, said resonator structure comprising:

an assembly holder with a support member;

a ferrite resonator element removably coupled to the assembly holder;

a substrate coupled to the assembly holder, the substrate including a coupling loop disposed in proximity to the ferrite resonator; and a base coupled to the support member of the assembly holder such that both the ferrite resonator element and the coupling loop are supported from the base by the support member.

2. A resonator structure comprising:

an assembly holder;

a ferrite resonator element removably coupled to the assembly holder;

a substrate coupled to the assembly holder, the substrate including a coupling loop disposed in proximity to the ferrite resonator, and a base coupled to the assembly holder, the ferrite resonator, and the substrate and the coupling loop by a cantilever support member.

3. The resonator structure of claim 2 wherein the cantilever support member is an integrated part of the assembly holder.

4. The resonator structure of claim 2 wherein the ferrite resonator is rotatably coupled to the assembly holder to allow crystallographic orientation of the ferrite resonator element with respect to the coupling loop.

* * * * *